(12) United States Patent
Sylvester et al.

(10) Patent No.: US 6,384,592 B1
(45) Date of Patent: May 7, 2002

(54) APPARATUS FOR MINIMIZING ANGULAR ROTOR POSITION ERRORS IN AN AIR CORE GAUGE

(75) Inventors: Gail M. Sylvester, Frankenmuth; Raymond Lippmann, Howell; James E. Nelson, North Branch, all of MI (US)

(73) Assignee: Delphi Technologies, Inc., Troy, MI (US)

( * ) Notice: Subject to any disclaimer, the term of this patent is extended or adjusted under 35 U.S.C. 154(b) by 59 days.

(21) Appl. No.: 09/692,858

(22) Filed: Oct. 23, 2000

(51) Int. Cl.[7] .......................... G01R 5/16; G01R 23/00
(52) U.S. Cl. .................... 324/144; 324/207.12
(58) Field of Search ........................... 324/143, 144, 324/146, 154 R, 140 R, 207.12, 207.16, 207.17, 225; 318/685, 696, 652, 254, 437

(56) References Cited

U.S. PATENT DOCUMENTS

| | | | | |
|---|---|---|---|---|
| 5,410,244 A | * | 4/1995 | Draves | 324/74 |
| 5,497,078 A | * | 3/1996 | Queen et al. | 324/146 |

* cited by examiner

*Primary Examiner*—Edward Lefkowitz
*Assistant Examiner*—Reena Aurora
(74) *Attorney, Agent, or Firm*—Stefan V. Chmielewski

(57) ABSTRACT

An apparatus for minimizing angular rotor position errors in an air core gauge includes an air core gauge (105) having a magnetic rotor (108) and at least three coils (102, 104 and 106) wound around the rotor (108). A probe signal is applied to the first coil (102), and output signals are developed and detected across the second and the third coils (104, 106) in response to the probe signal and low-frequency signals applied to one or more of the coils (102, 104 and 106). The output signals are processed by a demodulation circuit (110) and a number of DC voltage signals are produced therefrom. A control circuit (304) is responsive to the number of DC voltage signals to determine an actual angular position of the rotor (108), and to suitably adjust the low-frequency signals to thereby correct for errors between the actual angular position of the rotor (108) and the desired angular position thereof. Preferably, the three coils (102, 104 and 106) are disposed non-orthogonal relative to each other, and the rotor (108) defines a non-circular cross-section along a plane normal an axis of rotor rotation (109). The rotor (108) is further preferably formed of a combination of low and high permeability magnetic materials to thereby optimize a tradeoff between torque production and signal feedback capability.

14 Claims, 6 Drawing Sheets

APPARATUS FOR MINIMIZING ANGULAR ROTOR POSITION ERRORS IN AN AIR CORE GAUGE

TECHNICAL FIELD

The present invention relates generally to air core gauges, and more specifically to techniques for determining the position of a magnetic rotor in such an apparatus including at least three coils in proximity to the rotor.

BACKGROUND OF THE INVENTION

Typical analog displays, such as those used in vehicle instrument panels, utilize air core gauges or stepper motors to position pointers in relation to sensor values. Conventional air core gauge mechanisms typically include a rotor formed of a substantially circular disk of magnetized material that is fixed to a spindle, wherein the rotor is surrounded by at least two coils of wire, with at least one coil typically perpendicular to another of the coils. When electric current passes through the coils, a magnetic field is produced that exerts a force on the rotor. The angular direction of the magnetic field produced by the coils primarily depends on the number of ampere-turns in each of the coils, wherein the resultant magnetic field can be represented by the vector addition of the fields produced by each of the coils.

Stepper motors are inherently more accurate than air core gauges, although to achieve the higher accuracy, stepper motors typically incorporate a high stepdown gear ratio between the magnetic rotor and the pointer shaft or multipole rotors in combination with a geartrain. The additional parts required in typical stepper motors as compared with air core gauges undesirably increases the mechanism cost and often times necessitates, at least from a cost standpoint, the use of air core gauges.

A conventional two-coil air core gauge is typically driven by one of two known techniques. According to a first known technique, as shown in FIG. 1, the two coils are designated by reference numerals 36 and 38. Coil 38 is biased to a fixed voltage $V_{IGN}$ through resistor 34. The resistance of resistor 32 typically varies in relation to a physical parameter such as fuel level. Resistor 30 supplies current to coil 36 from $V_{IGN}$. The voltage across coil 36 is determined by a voltage divider comprised of resistor 30 and the parallel combination of resistor 32 and the resistance of coil 36, and the current flowing through coil 36 varies in proportion to the voltage thereacross. Coil 36 and coil 38 are arranged to generate orthogonal magnetic vectors that sum to form a resultant magnetic vector. As the current flowing through coil 36 varies in response to the changing resistance of resistor 32, the vector component of the magnetic field generated by coil 36 similarly varies. The direction and magnitude of the magnetic field resulting from vector addition of the field components generated by coils 36 and 38 thus varies in relation to the changing resistance of resistor 32. The magnetic rotor aligns with the resultant magnetic field direction, and its rotational position is thus determined by the direction of the resultant magnetic field which is determined by resistor 32.

According to a second known technique for driving a two-coil air gauge, as shown in FIG. 2, a signal on line 50 from a sensor (not shown), typically a signal with a frequency varying with a vehicle parameter, is converted to a corresponding analog voltage through a frequency-to-analog converting circuit 52. The resultant analog signal is provided as an input to a sine/cosine drive circuit 56, whereby the sine/cosine drive circuit 56 generates a current flowing through signal path 58 proportional to the cosine of the desired angle of deflection of the rotor, and a current flowing through signal path 60 proportional to the sine of the desired angle of deflection of the rotor. Coils 67 and 64, in response to the currents flowing through signal paths 58 and 60 respectively, develop magnetic fields with sine and cosine component magnetic vectors correlating to the desired pointer rotation. Various other techniques which are not set forth here are also known and are used to drive air core gauges.

Air core gauge error sources include hysteresis, pointer staking errors and linearity errors. Pointer staking and linearity errors can be minimized with a calibration process, although calibration of the mechanism typically adds investment and cycle time to the system cost. Hysteresis errors, on the other hand, typically cannot be compensated for in an open-loop system, wherein most conventional drive techniques for air core gauges, including those set forth above, are typically open-loop systems in which actuation currents are applied to the coils without the use of any feedback information as to the actual pointer position to allow for corrections to the values of the currents. If the center of mass of the pointer does not lie on the axis of the pointer spindle, the weight of the pointer will generally cause the pointer to sag from the angular position in which the magnetic field of the rotor aligns with the resultant magnetic field of the two coils.

One approach to addressing such hysteresis and other errors to thereby improve pointer position accuracy is disclosed in U.S. Pat. No. 5,489,842 (hereinafter '842 patent), owned by the assignee of the present invention, and the disclosure of which is incorporated herein by reference. The '842 patent discloses an air core gauge 411, as illustrated in FIG. 3, which includes a generally circular or cylindrical magnetic rotor 410 driven by two coils 412 and 414 about an axis 409 (shown in phantom), which are wound around perpendicular axes, B-F and O-D, respectively, and mounted within the proximity of the rotor 410. In addition to the normal rotation drive signal (not shown), coil 412 is coupled to a high frequency AC signal source (not shown) such that a high frequency current is superimposed onto the portion of the drive signal applied to coil 412. Since coils 412 and 414 are perfectly perpendicular, there is no magnetic coupling of the AC input signal from coil 412 to 414. However, rotor 410 provides a magnetic flux linkage between coils 412 and 414, thereby inducing a coupled AC output signal on coil 414 in response to the AC input signal on coil 412. Since the rotation drive signal is substantially DC, the rotation drive signal does not cause signal coupling between coils 412 and 414. Thus, because the frequency of the injected AC current is much higher than the frequency content of the nominally DC currents used to drive the rotor 410 to cause torque in the mechanism, the technique disclosed in the '842 reference makes it possible to simultaneously drive the rotor 410 to a desired position while determining the position of rotor 410 using filters (not shown) to separate the two activities.

The magnetic flux linkage between coil 412 and coil 414 is proportional to $\sin(i)*\sin(j)$, where i is the angle between the north pole 416 (or south pole 418) and a line drawn through points B and F, and j is the angle between the north pole 416 (or south pole 418) and a line drawn through points D and O. The magnetic flux linkage between coils 412 and 414 is further dependent upon the rotational position of rotor 410, so that the magnitude and phase of the AC output signal in coil 414 is accordingly dependent upon the rotational position of rotor 410. Thus, a measurement of the AC output signal in coil 414, or the ratio between the input and output AC signals, can be used to make a determination of the rotational position of rotor 410, and therefore the position of a pointer or other mechanism attached to the rotor 410.

While various causes of pointer position error, including hysteresis, can be compensated for with a closed-loop system of the type illustrated in FIG. 3, such systems have a number of drawbacks associated therewith. For example, the apparatus 411 illustrated in FIG. 3 and disclosed in the '842 reference has inherent accuracy limitations. More specifically, the feedback signal (output AC signal) is a substantially sinusoidal signal and, with two orthogonal coils, the resolution of the feedback mechanism is limited by the diminishing incremental change in magnitude of this signal as it approaches peaks and valleys. Moreover, the geometrical shape of the rotor 410 as well as its material composition are not optimal for rotor position resolution. What is therefore needed is an improved apparatus for maximizing angular rotor position resolution in an air core gauge, and for minimizing angular rotor position errors, that does not suffer from the drawbacks of known rotor position determination systems.

SUMMARY OF THE INVENTION

The foregoing shortcomings of the prior art are addressed by the present invention. In accordance with one aspect of the present invention, an apparatus for minimizing angular rotor position errors in an air core gauge comprises an air core gauge having at least three coils disposed proximate to a magnetic rotor with at least one of the coils disposed non-orthogonal relative to the remaining coils, wherein the rotor rotates in response to a composite magnetic field resulting from low-frequency current flowing through one or more of the coils. Means for inducing a probe signal separate from the low-frequency current in one of the at least three coils is also provided, wherein the rotor magnetically couples the probe signal to the other of the at least three coils to thereby produce separate composite signals therein, along with means responsive to the separate composite signals for determining an angular position of the rotor and adjusting the low-frequency current flowing through the one or more of the coils to thereby minimize rotor angular position errors.

In accordance with another aspect of the present invention, an apparatus for minimizing angular rotor position errors in an air core gauge comprises an air core gauge having at least three coils each disposed proximate to a magnetic rotor defining an axis of rotation therethrough and defining a non-circular cross-section along a plane normal to the axis of rotation. The rotor rotates about the axis of rotation in response to a composite magnetic field resulting from low-frequency current flowing through one or more of the coils. Means for inducing a probe signal separate from the low-frequency current in one of the at least three coils is also provided, wherein the rotor magnetically couples the probe signal to the other of the at least three coils to thereby produce separate composite signals therein, along with means responsive to the separate composite signals for determining an angular position of the rotor and adjusting the low-frequency current flowing through the one or more of the coils to thereby minimize rotor angular position errors.

In accordance with yet another aspect of the present invention, an apparatus for minimizing angular rotor position errors in an air core gauge comprises an air core gauge having at least three coils disposed proximate to a magnetic rotor formed of a combination of high and low permeability magnetic materials, wherein the rotor rotates in response to a composite magnetic field resulting from low-frequency current flowing through one or more of the coils. Means for inducing a probe signal separate from the low-frequency current in one of the at least three coils is also provided, wherein the rotor magnetically couples the probe signal to the other of the at least three coils to thereby produce separate composite signals therein, along with means responsive to the separate composite signals for determining an angular position of the rotor and adjusting the low-frequency current flowing through the one or more of the coils to thereby minimize rotor angular position errors.

One object of the present invention is to provide an improved system for minimizing angular rotor position errors in an air core gauge.

Another object of the present invention is to provide such a system by utilizing at least three coils with at least one of the at least three coils disposed non-orthogonal relative to the remaining coils.

Yet another object of the present invention is to provide such a system wherein the rotor defines a non-circular cross-section along a plane normal to its axis of rotation to thereby enable variable coupling between coils due to a change in mass inside each coil as the rotor rotates.

A further object of the present invention is to provide such a system wherein the rotor is formed of a combination of low and high permeability magnetic materials.

These and other objects of the present invention will become more apparent from the following description of the preferred embodiments.

BRIEF DESCRIPTION OF THE DRAWINGS

The present invention will now be described, by way of example, with reference to the accompanying drawings, in which.

DESCRIPTION OF THE PREFERRED EMBODIMENTS

In accordance with the present invention, an apparatus for maximizing angular rotor position resolution and for minimizing angular rotor position errors in an air core gauge includes a magnetic rotor disposed proximate to at least three coils, wherein at least one of the coils is disposed non-orthogonal relative to the remaining coils. The magnetic rotor is preferably asymmetrically shaped in that it defines a non-circular cross-section along a plane normal to its axis of rotation, and is further preferably formed of a combination of high and low permeability magnetic materials. The angular position of the rotor is determined by applying a probe signal to one of the coils, coupling it through the rotor, and measuring the amplitude of the resultant signal on each of the other coils. Resolution of the angular position of the rotor is improved over known techniques via such an apparatus.

Figure 1:
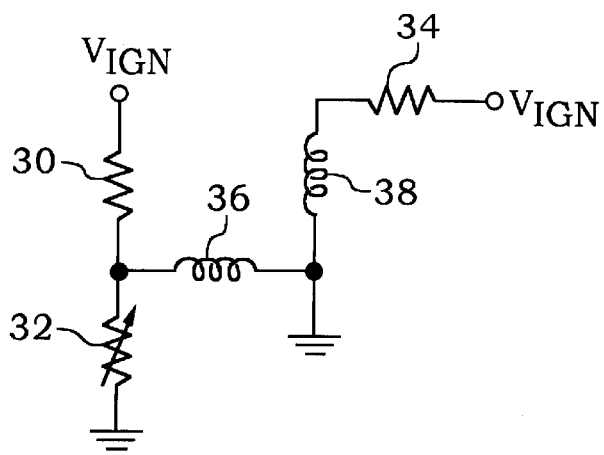
FIG. 1 is a schematic illustration of one known technique for driving air core gauges.
Figure 2:
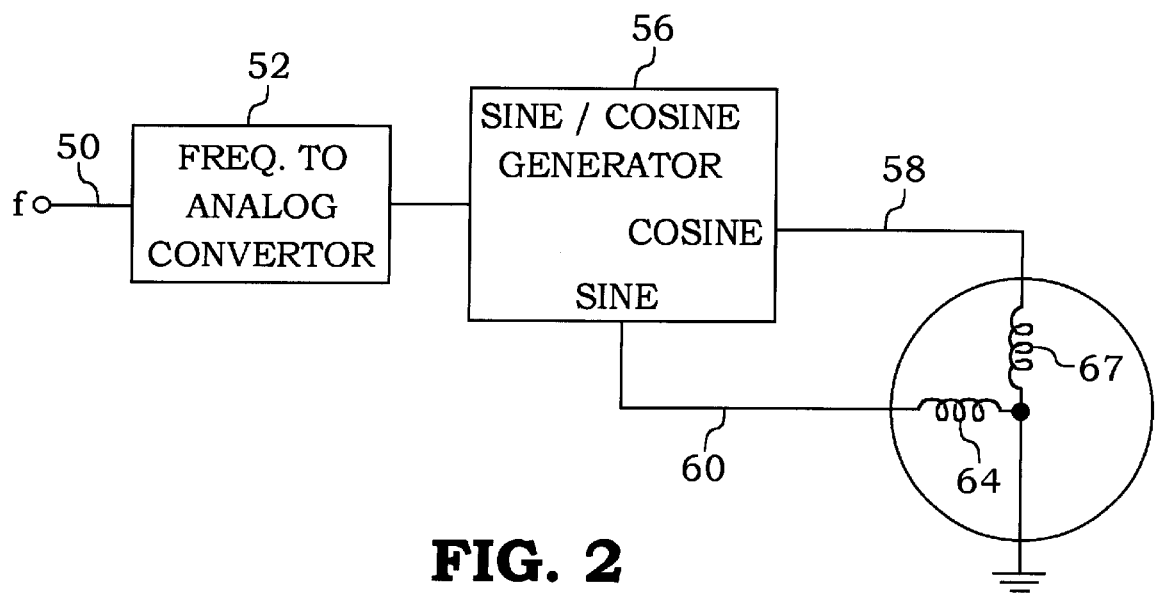
FIG. 2 is a schematic illustration of another known technique for driving air core gauges.
Figure 3:
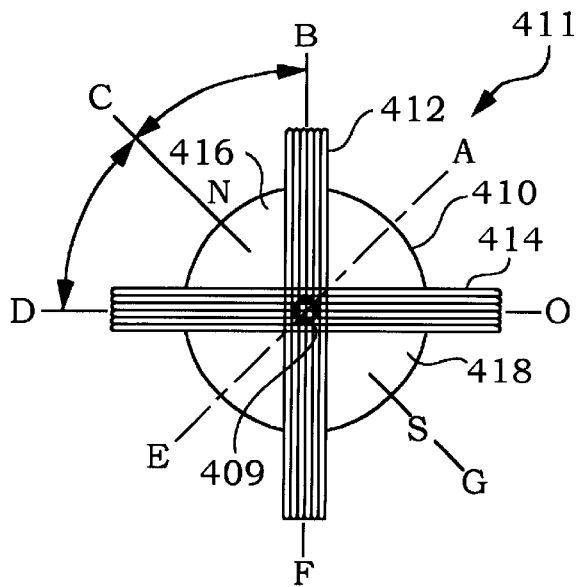
FIG. 3 is a schematic diagram of a prior art air core gauge.
Figure 4:
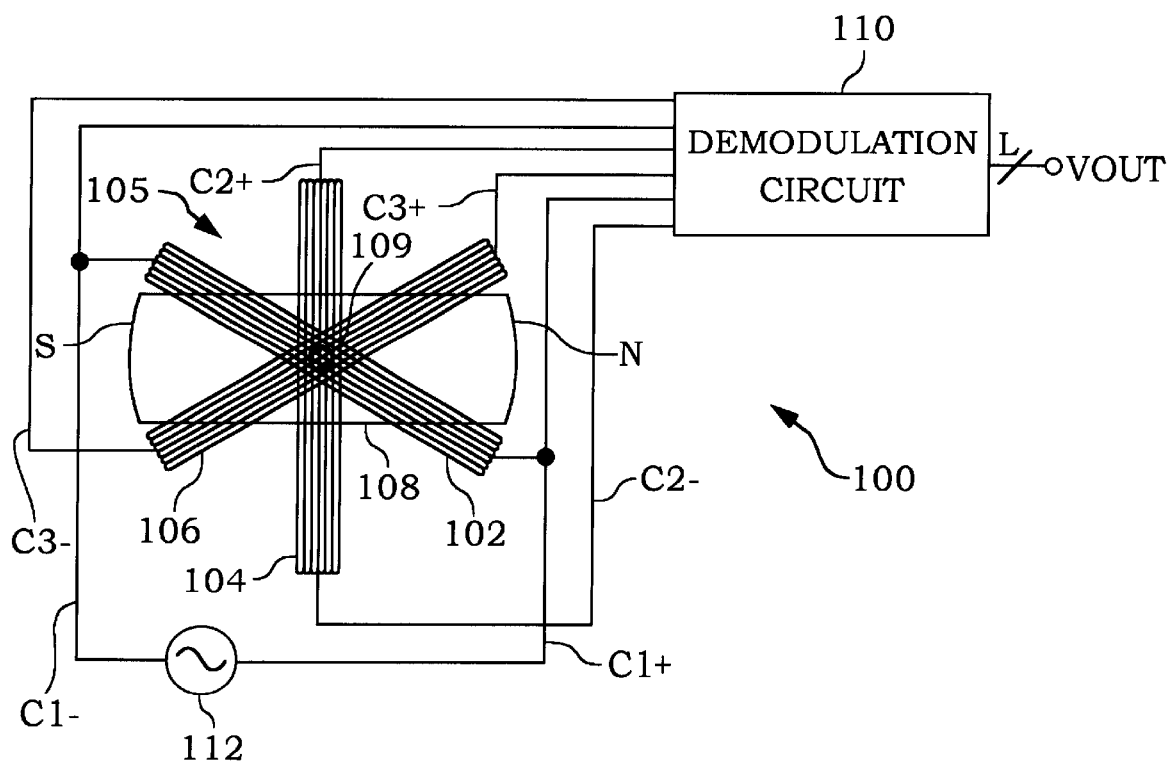
FIG. 4 is a schematic diagram of one preferred embodiment of an air core gauge and associated rotor position determination circuitry, in accordance with the present invention.

Referring now to FIG. 4, a schematic diagram of one preferred embodiment of a system 100 for determining angular rotor position in an air core gauge, in accordance with the present invention, is shown. System 100 includes one preferred embodiment of an air core gauge 105, in accordance with one aspect of the present invention, wherein gauge 105 includes first, second and third coils 102, 104 and 106 respectively, each representing separate windings of wire of the type found in conventional air core gauges. At least one of the coils 102, 104 and 106 is disposed in a non-orthogonal relationship relative to the other two. In one preferred embodiment, each coil 102, 104 and 106 is disposed approximately 60 degrees relative to the other two such that all of the coils 102, 104 and 106 are disposed non-orthogonal relative to each other, although the present invention contemplates other non-orthogonal positioning of one or more of the coils 102,104 and 106 relative to each other.

Each of the coils 102, 104 and 106 are electrically connected at their opposite ends to a demodulation circuit 110. Thus, for example opposite ends C1+ and C1− of the first coil 102, opposite ends C2+ and C2− of the second coil 104 and opposite ends C3+ and C3− of the third coil 106, are all connected to corresponding inputs of demodulation circuit 110, wherein circuit 110 produces a number, L, of output voltage signals VOUT, and wherein L may be any positive integer. In typical applications, L is generally equal to the number of coils −1. Thus, in the 3-coil embodiment illustrated in FIG. 4, L=2 and VOUT accordingly comprises a pair of output voltages that will be referred to hereinafter as VA and VB.

System 100 further includes a signal source 112 connected across one of the coils (e.g., coil 102 in FIG. 4), wherein signal source 112 is operable in one preferred embodiment to produce a high frequency (e.g., 20 kHz) AC probe current. Alternatively, or additionally, signal source 112 may be configured to produce a low-voltage (e.g., <5 volts) probe pulse that is injected onto coil 102. Suitable detection circuitry would then be used to monitor the magnitude of the coupled pulse, which is analogous to the RMS voltage monitored in a preferred embodiment described herein. In either case, the probe signal produced by signal source 112 is superimposed over, or injected onto, a low frequency (e.g., substantially DC) drive signal applied to the coil.

Figure 10A:
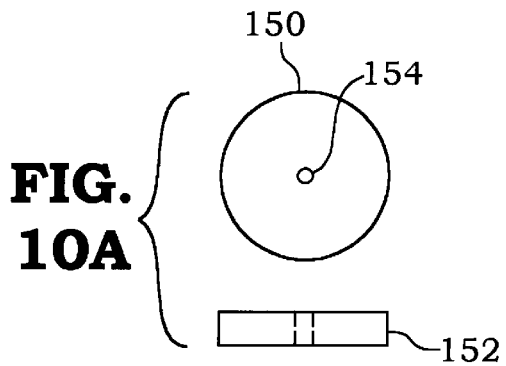
FIGS. 10A–10F various alternative shapes for the magnetic rotor, in accordance with the present invention.
Figure 10B:
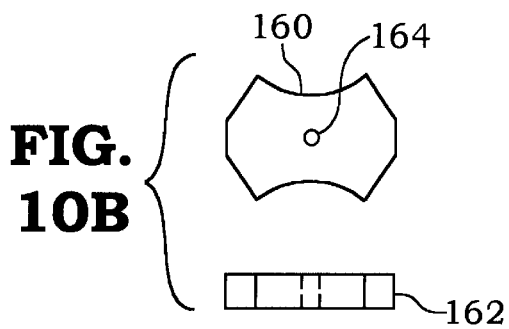
Figure 10C:
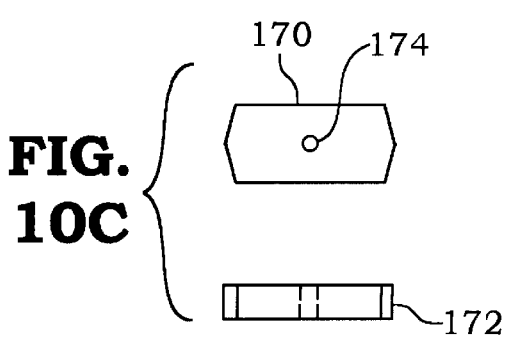
Figure 10D:
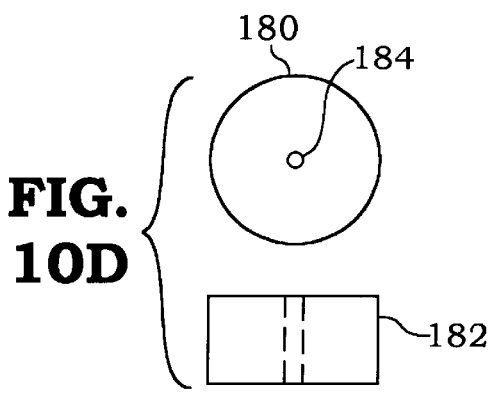
Figure 10E:
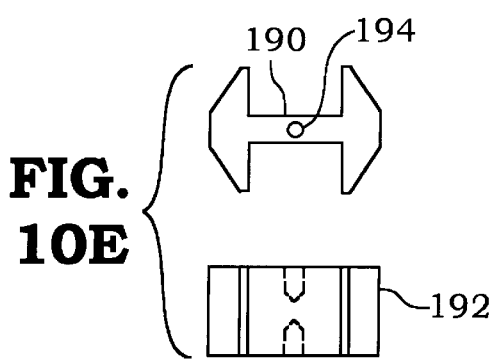
Figure 10F:
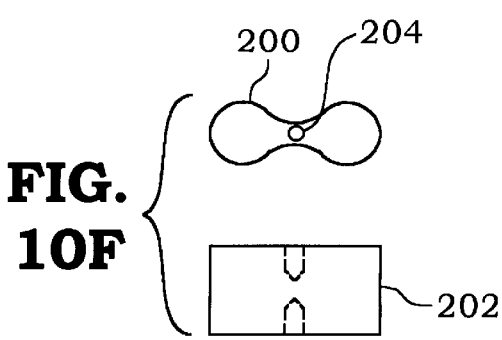

In accordance with another aspect of the present invention, system 100 further includes a magnetic rotor 108 disposed proximate to coils 102, 104 and 106 and defining an axis of rotation 109 therethrough. A pointer spindle and associated pointer (not shown) are preferably attached to rotor 108 at its axis of rotation, as is known in the art, such that the spindle and pointer rotate about the axis of rotation 109 as the rotor 108 correspondingly rotates. Rotor 108 has an asymmetrical (i.e., non-circular/cylindrical) shape about its periphery in that it defines a non-circular cross-section along a plane normal to the axis of rotation 109. For example, as illustrated in FIG. 4, rotor 108 may be a disk or cylinder that is oblong in cross-section along a plane normal to its axis of rotation 109. Other shapes are contemplated by the present invention, and examples of some such shapes are set forth in FIGS. 10A–10F. For example, referring to FIG. 10A, rotor 108 may exhibit an oval disc shape as shown by end-view 150 and side-view 152, with an axis of rotation 154. Alternatively, FIG. 10B illustrates another contemplated shape of rotor 108 as shown by end-view 160 and side-view 162 with an axis of rotation 164. Alternatively still, FIG. 10C illustrates yet another contemplated shape of rotor 108 as shown by end-view 170 and side view 172 with an axis of rotation 174. Referring to FIG. 10D, rotor 108 may further exhibit an oval-cylindrical shape as shown by end-view 180 and side-view 182 with an axis of rotation 184. In another alternative embodiment, FIG. 10E illustrates another contemplated shape of rotor 108 as shown by end-view 190 and side-view 192 with an axis of rotation 194. In a further alternative embodiment. FIG. 10F illustrates yet another contemplated shape of rotor 108 as shown by end-view 200 and side-view 202 with an axis of rotation 204. It is to be understood that FIGS. 10A–10F illustrate only some of the contemplated shapes of rotor 108, and that the present invention contemplates other shapes, the primary importance of any such other shapes being that the periphery of the rotor surface is non-symmetrical; i.e., that it defines a non-circular cross-section along a plane normal to its axis of rotation.

In addition to its asymmetrical shape, rotor 108 is, in accordance with yet another aspect of the present invention, composed of a combination of high permeability and low permeability magnetic materials. The primary purpose of such a composition is to cause larger changes in the magnetic coupling between pairs of coils 102, 104 and 106 as the rotor 108 rotates within the coils. Specifically, while rotation of the poles (N and S) of any magnetic rotor causes changes in the mutual inductance between any coil pair, providing a rotor 108 composed of a combination of high permeability and low permeability magnetic materials further contributes to, or enhances, such mutual inductance changes. This is because magnetic domains are difficult to re-orient in low permeability materials, therefore allowing for only a small amount of coupling to occur between coils, whereas the magnetic domains are more fluid in high permeability magnetic materials, therefore allowing for increased coupling between coils. Such a material blend thus provides for sufficient torque production from the low permeability magnetic materials and enhanced feedback characteristics from the high and low permeability magnetic materials. Because larger changes in mutual inductance between coil pairs can be realized with such magnetic compositions (as compared with magnets formed strictly of low permeability magnetic materials), rotor 108 may thus be provided with reduced mass over that of conventional rotors, thereby reducing cost and manufacturing complexity.

In one preferred embodiment, magnetic rotor 108 is composed of a hard magnetic material, such as $Nd_2Fe_{14}B$, in combination with a soft magnetic material, such as soft alpha iron in a polymer binder. As the rotor 108 rotates within the coils 102, 104 and 106, the volume of the soft alpha iron inside each of the coils changes, thus changing the magnetic coupling between any pair of coils, and hence the mutual inductance of any coil pair. The same effect may, however, be realized by incorporating into a low permeability rotor 108 an asymmetrical piece of any high permeability material such as, for example, pure iron or Mu metal. Such a resultant material combination may be formed via known techniques such as, for example, insert molding, adhesive attachment, snap fits, or the like.

Figure 5:
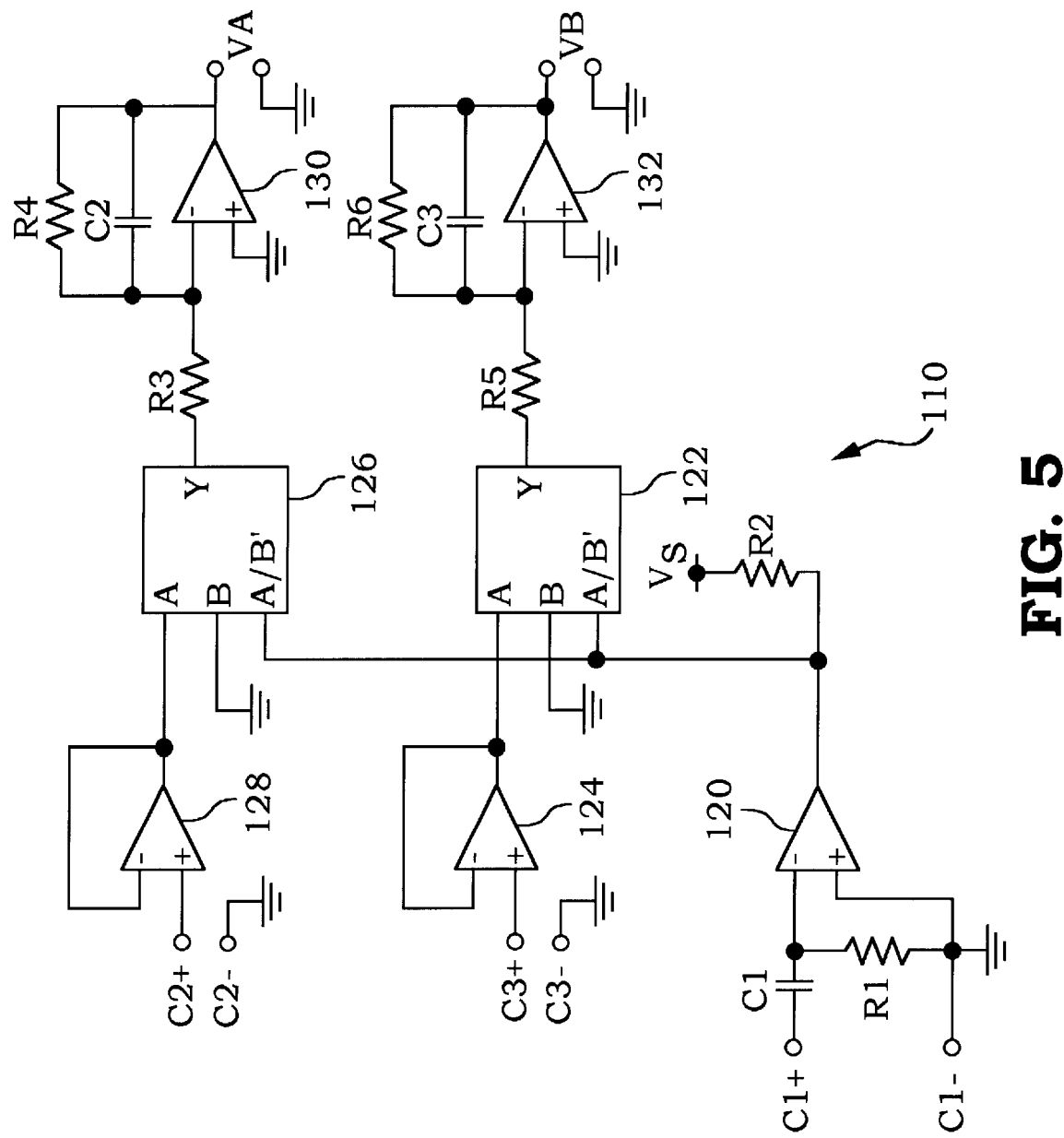
FIG. 5 is a schematic diagram of one preferred embodiment of the rotor position determination circuitry illustrated in FIG. 4, in accordance with the present invention.

Referring now to FIG. 5, one preferred embodiment of the demodulation circuit 110 illustrated in FIG. 4, in accordance with yet another aspect of the present invention, is shown. Circuit 110 includes a capacitor C1 having one end adapted to receive input signal C1+, and an opposite end connected to one end of a resistor R1 and to the inverting input of a comparator 120. The opposite end of R1, input signal C1– and the non-inverting input of comparator 120 are connected to ground reference, and the output of comparator 120 is connected to a supply voltage, $V_s$, through resistor R2. The combination of R1, R2 and C1 form a known zero-crossing detector circuit which is used in circuitry 110 to develop a phase reference signal from the probe signal injected into coil 102 via signal source 112. For the time duration that the probe signal is greater than zero, the phase reference signal is preferably a logic high level and otherwise a logic low level.

The non-inverting input of an operational amplifier 124 is connected to input signal C3+, and the inverting input of amplifier 124 is connected to its output to form a known buffer circuit. Input signal C3– is connected to ground reference. The non-inverting input of an operational amplifier 128 is connected to input signal C2+, and the inverting input of amplifier 128 is connected to its output to form another known buffer circuit. Input signal C2– is connected to ground reference.

Circuit 110 further includes a pair of demultiplexer circuits 122 and 126, wherein the "B" input of each circuit is connected to ground reference and the A/B' inputs are both connected to the output of comparator 120. The "A" input of demultiplexer circuit 122 is connected to the output of amplifier 124 and the "A" input of demultiplexer circuit 126 is connected to the output of amplifier 128. An output, "Y", of circuit 126 is connected to one end of a resistor R3, the opposite end of which is connected to the inverting input of an operational amplifier 130, one end of a resistor R4 and one end of a capacitor C2. The non-inverting input of amplifier 130 is connected to ground reference, and the opposite ends of R4 and C2 are connected to the output of amplifier 130. An output voltage VA of circuit 110 is defined between the output of amplifier 130 and ground potential.

An output, "Y", of circuit 122 is connected to one end of a resistor R5, the opposite end of which is connected to the inverting input of an operational amplifier 132, one end of a resistor R6 and one end of a capacitor C3. The non-inverting input of amplifier 132 is connected to ground reference, and the opposite ends of R6 and C3 are connected to the output of amplifier 132. An output voltage VB of circuit 110 is defined between the output of amplifier 132 and ground potential.

In the operation of system 100, the high frequency, sinusoidal probe signal produced by signal source 112 is induced in coil 102, and one or more low-frequency drive signals are applied to any of coils 102, 104 and 106 to thereby cause rotor 108 to be located at a desired position relative to coils 102, 104 and 106. The sinusoidal probe signal is coupled through the rotor 108 and coils, developing signals on coils 104 and 106. These developed signals are the same frequency as the probe signal, and have zero crossings at the same point in time as the probe signal. The phase relationships between the developed signals and the probe signal, however, are either 0 degrees or 180 degrees, with the amplitude varying as described in U.S. Pat. No. 5,489,842 which was previously incorporated herein by reference.

Amplifiers 124 and 128 prevent the demodulator circuit 110 from loading the voltages developed by the coupling on coils 104 and 106, and the zero crossing detector, formed by comparator 120, R1, R2 and C2, provides a phase reference signal from the probe signal which is injected into coil 102. Demultiplexers 122 and 126 pass the coil 104 and coil 106 signals to the integrating amplifiers 130 and 132. Over the course of an entire probe signal cycle, the integrated value of each of the developed signals on coil 104 and coil 106 are equal to zero. However, if only the first (or last) 180 degrees of phase is integrated, a non-zero value is detected. Demultiplexers 122 and 126 accomplish this by switching the input signals to the integrating amplifiers 130 and 132 only during the last 180 degrees of the probe signal.

Integrating amplifiers 130 and 132 develop polarized dc voltages VA and VB on their respective outputs which are proportional to the area of the signal waveforms applied from the respective outputs of the demultiplexer circuits 122 and 126. This is actually a two phase process. When the phase reference comparator 120 selects the A input of demultiplexers 122 and 126, the integrating amplifiers 130 and 132 accumulate voltage on their outputs. When the phase reference comparator 120 selects the B inputs, the output voltages VA and VB of the integrating amplifier 130 and 132 decay toward zero volts via R4 and R6. More generally, the output voltages VA and VB build when the phase reference is high, and decay when the phase reference is low. After a large number of cycles, the output voltages VA and VB of the integrating amplifiers stabilize at a substantially DC value where the currents through R4 and R6 exactly cancel the currents through R3 and R5. A small amount of ripple is typically present, but this can be minimized by appropriate selection of R and C values.

Figure 6:
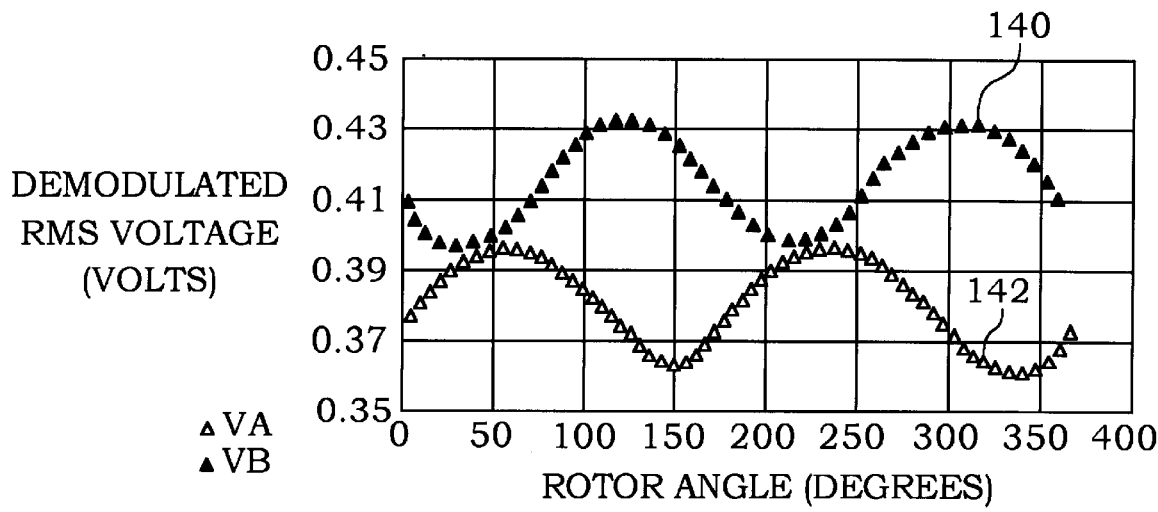
FIG. 6 is a plot of demodulated RMS voltage produced by the circuitry illustrated in FIG. 5 vs. rotor angle.
Figure 7:
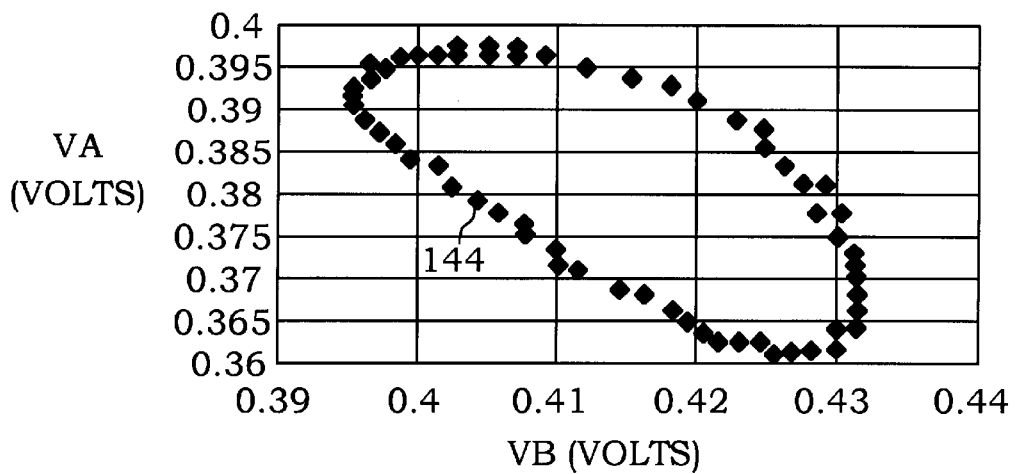
FIG. 7 is a plot of demodulated voltage corresponding to coil 104 vs. the demodulated voltage corresponding to coil 106, wherein such demodulated voltages are produced by the circuitry of FIG. 5.

When plotted against rotor position, as shown in FIG. 6, the DC voltages VA and VB each produce substantially sinusoidal functions 140 and 142 respectively, wherein the two functions 140 and 142 are separated from each other by approximately 60 degrees of phase. Careful inspection of FIG. 6 reveals a primary advantage of utilizing a non-orthogonal three-coil structure, such as that shown in FIG. 4, as compared with two orthogonal coils as in the prior art. Specifically, it should be noted that as one of the signals 140 and 142 is peaking, the other is in a more linear region. Thus, one problem associated with known rotor position determining systems, i.e., that of diminishing incremental change in output magnitude about peaks and valleys, can be avoided with system 100 by processing functions 140 and 142 such that only output voltages away from peak voltages are processed. Such advantageous signal processing may be more clearly seen with reference to FIG. 7 which shows the output voltage VA plotted against the output voltage VB. The resulting curve 144 is pseudo-elliptical, thereby clearly illustrating the phase separation of signals VA and VB. It should be noted that although the output voltage resolution of system 100 is best when traversing the minor axis region of curve 144 and diminishes near the major axis region, the resolution never approaches zero. Using the techniques described herein, fewer bits of resolution are, in fact, required to achieve the same accuracy (in degrees of rotor angle) of known two-coil (orthogonal) structures as shown below in Table 1. The air core gauge 105 may be driven, according to known techniques, by applying appropriate DC voltages to any combination of the three coils 102, 104 and

106 to thereby correspondingly modify the position of the rotor.

TABLE 1

| RESOLUTION (DEGREES) | SYSTEM 100 | TWO ORTHOGONAL COIL DEVICE |
|---|---|---|
| 5 | 2 bits | 6 bits |
| 1 | 5 bits | 11 bits |
| 0.1 | 9 bits | 18 bits |

Figure 8:
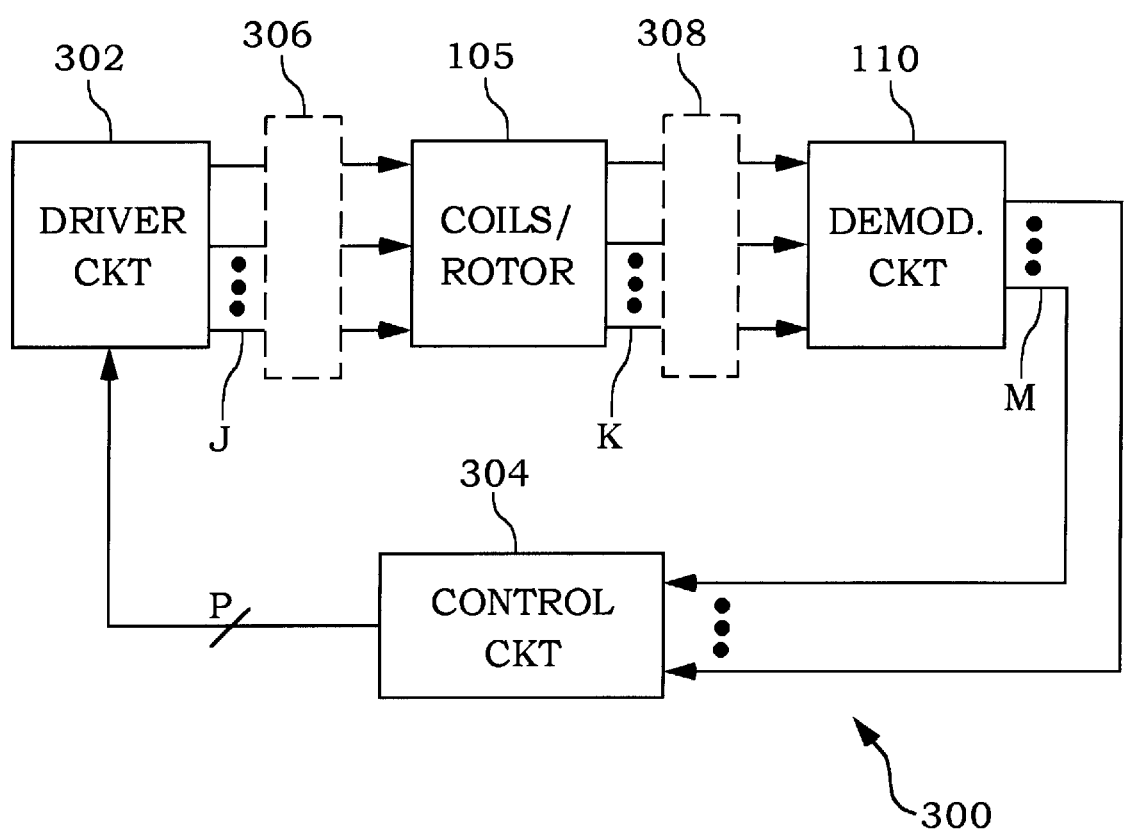
FIG. 8 is a diagrammatic illustration of one preferred embodiment of a control system for maximizing angular rotor position resolution in an air core gauge system, incorporating the concepts of the present invention.

Referring now to FIG. 8, one preferred embodiment of a control system 300 for maximizing angular rotor position resolution in an air core gauge system, is shown. Preferably, control system 300 utilizes the air core gauge 105 and demodulation circuitry 110 of the present invention, wherein a conventional air core gauge driver circuit 302 is connected to air core gauge 105 via a number, J, of signal paths, wherein J may be any positive integer. In the example shown in FIG. 4, J=3 and driver circuit 302 is operable to provide a low frequency or DC drive signal to one of the coils 102, 104 and 106 of air core gauge 105 via one of the signal paths, as is known in the art, to effectuate desired positioning of a pointer or other mechanism connected to, or controlled by, rotor 108. Additionally, driver circuit 302 includes the AC signal source 112 of FIG. 4, wherein source 112 is connected to one of the coils 102, 104 and 106 via the remaining two signal paths. Air core gauge 105 is connected to demodulation circuit 110 via a number, K, of signal paths, wherein K may be any positive integer. In the example shown in FIGS. 4 and 5, K=6 (2 signal paths each from coils 104 and 106, and the two high frequency signals applied by source 112), wherein the demodulation circuit 110 is responsive to signals provided thereto by air core gauge 105 to produce a number, M, of DC voltage output signals, wherein M may be any positive integer. In the example illustrated in FIG. 5, M=2, whereby DC voltage signals VA and VB are produced. In any event, the number, M, of output signal paths of demodulation circuit 110 are connected to a corresponding number of signal inputs of a control circuit 304 of known construction. A number, P, of signal paths connect the control circuit 304 to the driver circuit 302. In one preferred embodiment, control circuit 304 is a microprocessor-based controller or control computer, although those skilled in the art will recognize that control circuit 304 may be constructed of, or include, other known circuitry. The primary importance of any such control circuit 304 lies in its ability to process the output signals from demodulation circuit 110 and to correspondingly control driver circuit 302, in accordance with known control techniques, to thereby minimize rotor position errors and maximize rotor position resolution. A look-up table may be easily generated by one of ordinary skill from curve 144 (FIG. 7) and included within control circuit 304 so that a measured position signal can be determined therefrom.

In order to combine events of driving the rotor 108 to the desired angular position and determining angular position of the rotor 108, filtering is preferably provided to maintain independent operation of drive and sensing circuits (coils are shared between circuits 110 and 302). An example of such filtering is shown in phantom FIG. 8. More specifically, a high-pass filter circuit 306 keeps low frequency drive signals from interfering with the demodulator circuit 110, and a low-pass filter 308 keeps the drive circuit 302 from loading the coupled probe signal.

Figure 9A:
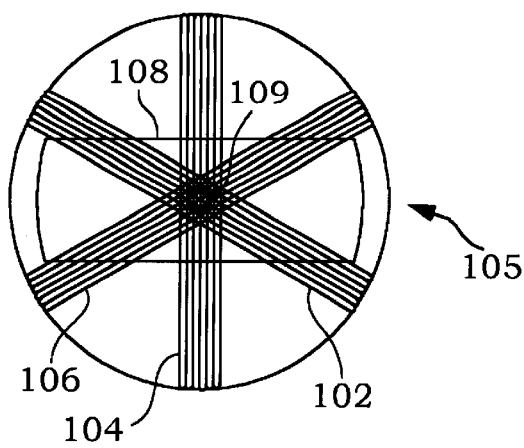
FIGS. 9A and 9B are schematic diagrams illustrating some torque driving principles of the air core gauge embodiment shown in FIG. 4.
Figure 9B:
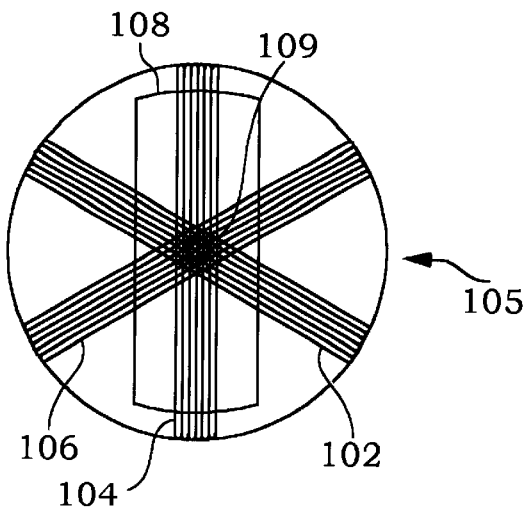

The electronic drive for the gauge 105 in accordance with the present invention is configured such that maximum torque will be applied to the magnet. The torque of an air core device is at a maximum when the magnetic vector applied is 90 degrees away from the rotor pole vector. For example, if rotor 108 is in the position shown in FIG. 9A, the combined vectors of coils 102 and 106 will be the most effective to exert a torque on the magnet. Similarly, if rotor magnet 108 is in the position shown in FIG. 9B, a magnetic vector generated by coil 104 will apply maximum torque to the magnet rotor 108. Torque is proportional to the number of turns and the current flowing through the wire (amp-turns), as is known in the art, and the total amount of wire and/or current needed in system 100 may thus be reduced from that of the conventional air core gauges.

While the invention has been illustrated and described in detail in the foregoing drawings and description, the same is to be considered as illustrative and not restrictive in character, it being understood that only the preferred embodiments have been shown and described and that all changes and modifications that come within the spirit of the invention are desired to be protected.

What is claimed is:

1. An apparatus for minimizing angular rotor position errors in an air core gauge, comprising:

an air core gauge having at least three coils disposed proximate to a magnetic rotor with at least one of said at least three coils disposed non-orthogonal relative to the remaining ones of said at least three coils, said rotor rotating in response to a composite magnetic field resulting from low-frequency current flowing through one or more of said coils;

means for inducing a probe signal separate from said low-frequency current in one of said at least three coils, said rotor magnetically coupling said probe signal to the other of said at least three coils to thereby produce separate composite signals therein; and means responsive to said separate composite signals for determining an angular position of said rotor and adjusting said low-frequency current flowing through said one or more of said coils to thereby minimize rotor angular position errors.

2. The apparatus of claim 1 wherein said probe signal is a high frequency AC current signal.

3. The apparatus of claim 1 wherein said means responsive to said separate composite signals includes:

means responsive to said separate composite signals for determining an angular position of said rotor and producing a number of rotor position signals;

means responsive to said rotor position signals for determining a difference between said angular position of said rotor and a desired angular rotor position, and for producing a number of current adjustment signals based thereon; and means responsive to said number of current adjustment signals to adjust said low-frequency current flowing through one or more of said coils.

4. The apparatus of claim 1 wherein said rotor defines an axis of rotation therethrough, said rotor defining a non-circular cross-section along a plane normal to said axis of rotation.

5. The apparatus of claim 4 wherein said rotor is formed of a combination of high and low permeability magnetic materials.

6. An apparatus for minimizing angular rotor position errors in an air core gauge, comprising:

an air core gauge having at least three coils each disposed proximate to a magnetic rotor defining an axis of rotation therethrough, said rotor defining a non-circular cross-section along a plane normal to said axis of rotation and rotating about said axis of rotation in response to a composite magnetic field resulting from low-frequency current flowing through one or more of said coils;

means for inducing a probe signal separate from said low-frequency current in one of said at least three coils, said rotor magnetically coupling said probe signal to the other of said at least three coils to thereby produce separate composite signals therein; and means responsive to said separate composite signals for determining an angular position of said rotor and adjusting said low-frequency current flowing through said one or more of said coils to thereby minimize rotor angular position errors.

7. The apparatus of claim 6 wherein said probe signal is a high frequency AC current signal.

8. The apparatus of claim 6 wherein said means responsive to said separate composite signals includes:

means responsive to said separate composite signals for determining an angular position of said rotor and producing a number of rotor position signals;

means responsive to said rotor position signals for determining a difference between said angular position of said rotor and a desired angular rotor position, and for producing a number of current adjustment signals based thereon; and means responsive to said number of current adjustment signals to adjust said low-frequency current flowing through one or more of said coils.

9. The apparatus of claim 6 wherein said rotor is formed of a combination of high and low permeability magnetic materials.

10. An apparatus for minimizing angular rotor position errors in an air core gauge, comprising:

an air core gauge having at least three coils each disposed proximate to a magnetic rotor formed of a combination of high and low permeability magnetic materials, said rotor rotating in response to a composite magnetic field resulting from low-frequency current flowing through one or more of said coils;

means for inducing a probe signal separate from said low-frequency current in one of said at least three coils, said rotor magnetically coupling said probe signal to the other of said at least three coils to thereby produce separate composite signals therein; and means responsive to said separate composite signals for determining an angular position of said rotor and adjusting said low-frequency current flowing through said one or more of said coils to thereby minimize rotor angular position errors.

11. The apparatus of claim 10 wherein said probe signal is a high frequency AC current signal.

12. The apparatus of claim 10 wherein said means responsive to said separate composite signals includes:

means responsive to said separate composite signals for determining an angular position of said rotor and producing a number of rotor position signals;

means responsive to said rotor position signals for determining a difference between said angular position of said rotor and a desired angular rotor position, and for producing a number of current adjustment signals based thereon; and means responsive to said number of current adjustment signals to adjust said low-frequency current flowing through one or more of said coils.

13. The apparatus of claim 10 wherein said low permeability material is a hard magnetic material and said high permeability material is a soft magnetic material;

and wherein said combination of high and low permeability materials is formed as a blend of said hard magnetic material and said soft magnetic material.

14. The apparatus of claim 13 wherein said hard magnetic material is $Nd_2Fe_{14}B$ and said soft magnetic material is a soft alpha iron in a polymer binder.

* * * * *